(12) United States Patent
Schweighart

(10) Patent No.: US 8,629,469 B2
(45) Date of Patent: Jan. 14, 2014

(54) LED ASSEMBLY WITH A PROTECTIVE FRAME

(75) Inventor: Marko Schweighart, Wildon (AT)

(73) Assignee: Ledon Lighting Jennersdorf GmbH, Jennersdorf (AT)

( * ) Notice: Subject to any disclaimer, the term of this patent is extended or adjusted under 35 U.S.C. 154(b) by 582 days.

(21) Appl. No.: 12/812,453

(22) PCT Filed: Dec. 22, 2008

(86) PCT No.: PCT/EP2008/011029
§ 371 (c)(1),
(2), (4) Date: Oct. 11, 2010

(87) PCT Pub. No.: WO2009/086909
PCT Pub. Date: Jul. 16, 2009

(65) Prior Publication Data
US 2011/0186885 A1 Aug. 4, 2011

(30) Foreign Application Priority Data
Jan. 11, 2008 (DE) .......................... 10 2008 003 971

(51) Int. Cl.
*H01L 33/00* (2010.01)
(52) U.S. Cl.
USPC .................. 257/98; 257/E33.06; 257/33.066; 438/27
(58) Field of Classification Search
USPC .................. 257/98, E33.06, E33.066; 438/27
See application file for complete search history.

(56) References Cited

U.S. PATENT DOCUMENTS

| 2004/0208210 A1 | 10/2004 | Inoguchi |
| 2005/0162808 A1 | 7/2005 | Nakai |

(Continued)

FOREIGN PATENT DOCUMENTS

| DE | 195 36 464 A1 | 4/1997 |
| DE | 101 17 889 A1 | 10/2002 |
| WO | 2007/108616 A1 | 9/2007 |

OTHER PUBLICATIONS

International Preliminary Report on Patentability, mailed Apr. 22, 2008, issued in corresponding International Application No. PCT/EP2008/011029, filed Dec. 22, 2008.

(Continued)

*Primary Examiner* — Marvin Payen
(74) *Attorney, Agent, or Firm* — Christenson O'Connor Johnson Kindness PLLC

(57) ABSTRACT

The invention relates to an LED assembly comprising a carrier (T, T'), at least one LED chip (2, 102) which is arranged on the carrier (T, T'), the LED chip (2, 102) being connected to at least one bonding wire (3, 103), a transparent layer (8, 108) applied over the LED chip (2, 102) and a frame (4, 104) which surrounds the at least one LED chip (2, 102). The frame (4, 104) comprises at least one web (5, 105) so as to divide the frame (4, 104) into at least a first frame region (6, 106), which comprises the at least one LED chip (2, 102), and at least a second frame region (7, 107). The first frame region (6, 106) laterally delimits the layer (8, 108) and the second frame region (7, 107) forms a protective region for the at least one bonding wire (3, 103). By means of the assembly according to the invention, an LED assembly can be achieved which is of simple construction, can be easily assembled and also effectively protects the bonding wires against mechanical influences.

21 Claims, 6 Drawing Sheets

(56) References Cited

U.S. PATENT DOCUMENTS

| | | |
|---|---|---|
| 2006/0022215 A1 | 2/2006 | Arndt |
| 2006/0102917 A1* | 5/2006 | Oyama et al. .................. 257/99 |
| 2006/0255355 A1 | 11/2006 | Brunner |
| 2007/0029564 A1 | 2/2007 | Han |
| 2007/0090382 A1 | 4/2007 | Ryu |
| 2008/0006841 A1 | 1/2008 | Okimura |

OTHER PUBLICATIONS

International Search Report, mailed Jul. 17, 2009, issued in corresponding International Application No. PCT/EP2008/011029, filed Dec. 22, 2008.

* cited by examiner

LED ASSEMBLY WITH A PROTECTIVE FRAME

The invention relates to an LED assembly and a method for the production thereof, which assembly comprises an LED chip arranged on a carrier, the LED chip being connected to at least one bonding wire.

Numerous LED assemblies are known from the prior art which have an LED chip arranged on a carrier, such as a printed circuit board. A colour-conversion material or transparent material is applied to the LED chip, for example from a cannula, by means of what is known as the globe-top method. The material must exhibit a specific (minimum) viscosity so as not to flow away but remain stable as a layer above the chip. In this form, the globe-top effectively mechanically protects the chip and the bonding wires.

In order to be able to image white LEDs effectively via optical systems it is necessary for the luminous surface to be as small as possible. In this case, however, the thickness and width of this layer are spatially configured so as to be smaller than the bonding wires extending from the LED chip, via which the LED chip is connected to the connections on the carrier. The bonding wires thus extend beyond the layer and are therefore exposed, and there is thus a risk that the bonding wires, which are very fine and have a diameter measuring from approximately 25 to 50 μm, may be damaged as a result of mechanical influences. In this regard it is known for example for a frame completely surrounding the LED assembly to be arranged around it and to be lined with transparent material so as to protect the LED assembly.

The object of the invention is thus to provide an LED assembly which is of simple construction and easy to assemble and also effectively protects the bonding wires against mechanical influences.

This object is achieved by the features of the independent claims. The dependent claims develop further the central idea of the invention in a particularly advantageous manner.

According to the invention, the LED assembly comprises the following features: a carrier, at least one LED chip which is arranged on the carrier, the LED chip being connected to at least one bonding wire, a substantially transparent layer applied over the LED chip and a frame which surrounds the at least one LED chip. The frame comprises at least one web so as to divide the frame into at least a first frame region, which contains the at least one LED chip, and at least a second frame region. The first frame region laterally bounds or delimits the layer and the second frame region forms a protective region for the at least one bonding wire.

The frame is advantageously formed in at least two parts—a first frame part and a second frame part. In a first embodiment, the first frame part may form the first frame region and the second frame part may form the second frame region. In a second preferred embodiment, the first frame part comprises the first frame region and the second frame region, and the second frame part is arranged on the first frame part in such a way that the second frame region of the first frame part is covered, at least in part.

The web is thus preferably formed integrally with the frame.

The layer advantageously consists of a colour-conversion layer which absorbs some light of a first wavelength and emits light of a second wavelength.

The layer is advantageously a transparent layer. The layer may also be formed as a diffuser layer.

The bonding wire advantageously extends over the web in a curved manner from the first frame region into the second frame region.

The web advantageously comprises at least one recess, in which the wire portion of the bonding wire curved over the web is arranged in a protected manner. In a preferred embodiment, the recess comprises at least one setback, in which the wire portion of the at least one bonding wire curved over the web is arranged in a protected manner.

The upper edge of the first frame region is advantageously of at least such a height that it finishes in line with the surface of the layer applied over the LED chip.

The height of the frame advantageously extends above the bonding wire at the highest point thereof, at least in part.

The frame is advantageously formed of an electrically non-conductive material. This material may, for example, be ceramic, plastics material, metal, silicone, glass, carbon fibre, fibreglass, silicon or a combination thereof. In a preferred embodiment, the material of the frame is temperature-resistant, preferably up to a temperature of at least 150° C. It is further advantageous for the material of the frame to be capable of adhering effectively, for example to the carrier material.

The LED assembly comprises a transparent layer applied over the LED chip and a frame which surrounds the at least one LED chip, the frame comprising at least one web so as to divide the frame into at least a first frame region, which comprises the at least one LED chip, and at least a second frame region, the first frame region also laterally delimiting the layer and the second frame region forming a protective region for the at least one bonding wire.

On the one hand, by way of the simple arrangement of the frame and its two regions, the layer to be arranged over the LED chip is laterally delimited, this delimitation also delimiting a precisely predefined volume for this layer, for example a colour-conversion layer, to be dispensed, the bonding wire being simultaneously embedded in the layer so as to be protected, at least on the chip side. Because of the predefined volume, the frame thus makes it possible to apply the layer or dispense materials having low viscosity, i.e. high fluidity, in a particularly simple manner over the LED chip since the material is clearly delimited by means of the predefined volume of the first frame region and thus cannot flow away. Thin layers, hereinafter also called dispense layers, may thus also be applied which are thinner than the thickness which is obtained, for example, as a result of applying a globe-top layer. Furthermore, the shape of the layer is also not restricted to a lentoid shape known previously, so the upper face may also be flat for example. On the other hand, the layer also protects the bonding wires against mechanical influences. Mechanical influences are to be understood, for example, as meaning direct contact or other mechanical contact during and, in particular, after the LED assembly has been fitted on a carrier.

By means of the protective region, which is defined by the frame, for the at least one wire, a protective frame for the wire is also provided in a simple manner, without having to position the wire separately. The sensitive, fine bonding wire is thus protected against mechanical influences in a simple manner and, at the same time, a defined space with a small volume is provided, in which a layer can be applied over the LED chip in a reliable, simple and cost-effective manner, this layer being of optimal thickness and of any shape. Although the bonding wire protrudes from the optimally formed layer, it is still arranged safely within the protective region and is thus protected against mechanical influences over its entire length.

The frame is also formed at least in two parts—a first frame part and a second frame part. It is thus possible to adjust the division of the frame, i.e. the first and second frame regions, individually in accordance with the configuration of the LED assembly and to ensure that the frame regions of the frame are arranged in a simple manner relative to one another.

In a first embodiment, the first frame part forms the first frame region, whereas the second frame part forms the second frame region. It is thus possible for each of the frame regions to be shaped individually, it also being possible for the frame regions to be positioned separately relative to one another depending on the circumstances.

In a second embodiment, the first frame part comprises both the first frame region and the second frame region, and the second frame part is arranged on the first frame part in such a way that the second frame region is covered, at least in part. The protection for the bonding wires is thus improved in comparison to that offered by a one-piece configuration since the second frame part can only be fitted once the bonding wires have been bonded. The first frame part thus already comprises the two frame regions according to the invention and therefore offers easy access to these two frame regions when the first frame part is fitted to a carrier. In addition, the bonding wires are sufficiently protected since the second frame region can be covered as much as possible by the arrangement of the second frame part and the bonding wire is also protected as much as possible even on the side remote from the LED chip in relation to the web. The first frame part may thus be configured so as to be particularly easily accessible in such a way that the contacts can easily be reached during bonding whilst the frame still protects the bonding wire as much as possible, even at the wire portion which is not embedded in the aforementioned layer.

Furthermore, the web is preferably formed integrally with the frame. The web is thus arranged directly at the location intended therefor and it is easier to position and fix in place the frame and the bonding wires. Production and process steps during manufacture and assembly can also be reduced, thus lowering the cost of the LED assembly. Furthermore, when formed integrally with the first frame part, the web may also be formed so as to be flatter, it thus being possible for the height of the LED assembly to be configured more freely and in an optimised manner.

The layer may also consist of a colour-conversion layer which absorbs some light of a first wavelength and emits light of a second wavelength. The function of the layer to protect the bonding wire against mechanical influences is thus simultaneously assumed by the colour-conversion layer. The light spectrum may thus be increased in a simple manner, that is to say white LEDs in particular (i.e. coloured LEDs with a colour-conversion layer) are also provided whilst the complete structure of the LED assembly is also considerably simplified.

The layer may also be a transparent layer, the transparent layer thus also assuming the function of the layer to protect the bonding wires.

The layer may also be a diffuser layer which thus also immediately assumes the function of the protective layer, the LED assembly thus being simplified and, at the same time, the bonding wires being effectively protected against mechanical influences.

In addition, the bonding wire extends over the web in a curved manner from the first frame region into the second frame region. One end of the bonding wire may thus be bonded in the first frame region, i.e. to the LED chip, whilst the end of the bonding wire may be bonded in the second region to a connection point, for example a conductor of a circuit board. The two regions are thus easily divided, it being possible for the volume of the layer in the first frame region to be clearly defined by the lateral delimitation whilst, on the other hand and independently thereof as far as possible, the bonding wire is safely arranged in the other frame region and is thus protected against mechanical influences. The bonding of the bonding wires is thus simplified and the bonding wire is simultaneously protected on the chip side of the frame by the corresponding layer and also by the protective region of the frame.

The web further preferably comprises at least one recess, in which the wire portion of the at least one bonding wire curved over the web is arranged so as to be protected, the recess particularly preferably comprising at least one setback. The bonding wires are further protected against mechanical influences by means of their arrangement in said recesses. This is, in particular but not exclusively, advantageous in frames configured as a single piece since, in this manner, the frame walls and the web may be formed so as to be of the same height whilst the bonding wire however does not extend above the frame.

Furthermore, the upper edge of the first frame region is at least of such a height that it finishes in line with the surface of the layer applied over the LED chip. It is thus considerably easier to dispense a predefined optimised layer which is as thin as possible and, as already mentioned above, is configured as a colour-conversion layer, a transparent layer or a diffuser layer and simultaneously protects the bonding wire against mechanical influences. The height may also be minimised in such a way that the LED assembly may also be smaller.

The second frame region is also taller than the bonding wire at its highest point. The bonding wire is thus lower than the frame and is therefore not exposed, the at least one bonding wire thus being further protected against mechanical influences.

Furthermore, the frame is formed of an electrical non-conductive material, such as ceramic, plastics material, metal, silicone, glass, carbon fibre, fibreglass, silicon or a combination thereof. The material of the frame is thus temperature-resistant up to a temperature of 150° C. It is thus possible to protect the material effectively against the elevated temperatures which usually occur during the process of curing colour-conversion materials or other dispense materials for example and to thus avoid damaging the frame.

The material of the frame can also be effectively adhered, for example to the carrier material. It is thus easy to assemble the frame and the LED assembly which will also have a long service life.

Further features, advantages and details of the invention will now be described with reference to embodiments and the figures of the accompanying drawing, in which.

Figure 1:
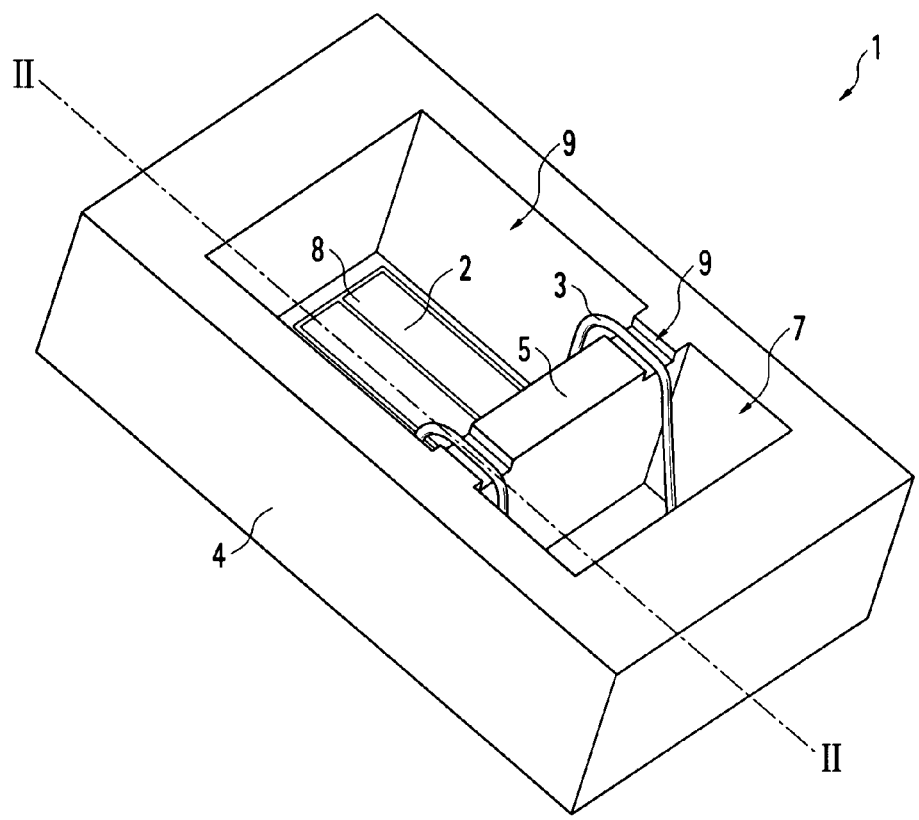
FIG. 1 is a perspective view of an LED assembly according to a first embodiment.
Figure 2:
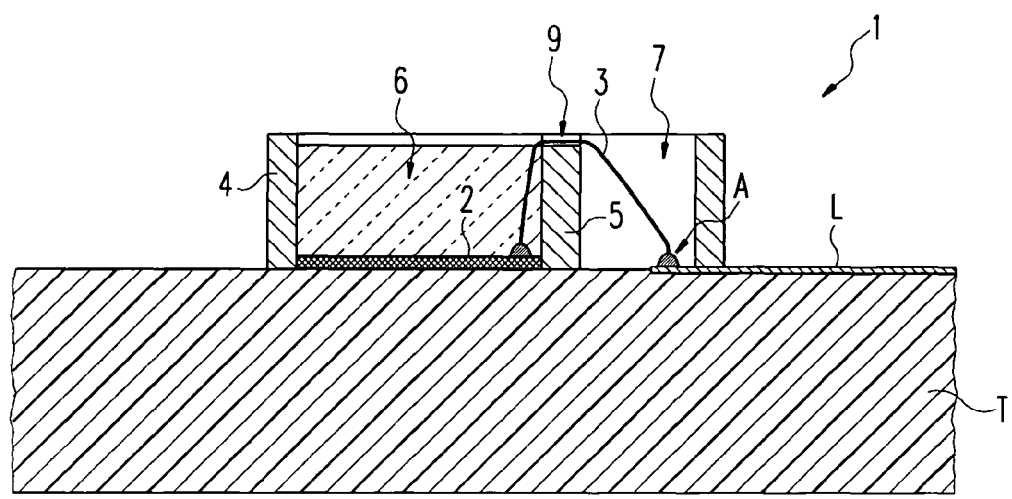
FIG. 2 is a sectional view of the LED assembly according to the invention along line II-II in FIG. 1.

FIGS. 1 and 2 show a first preferred embodiment of an LED assembly 1. FIG. 2 is a sectional view along line II-II in FIG. 1. The LED assembly 1 includes a carrier T. This carrier T is, for example, a circuit board. The carrier T preferably includes at least one conductor L. The conductor L is further preferably applied to the carrier T by means of etching or a different method.

Furthermore, at least one LED chip 2 is arranged on the carrier T, preferably adhesively bonded or soldered. The LED chip 2 preferably emits light of a first wavelength. The LED chip 2 may also be arranged on the carrier T either with its upper face facing upwards, or even vertically or in any other known manner.

The LED chip 2 is also connected to an end of at least one bonding wire 3, hereinafter also referred to as a wire. This wire 3 is in turn bonded at its other end to a connection point A, such as a conductor L, on the carrier T.

Furthermore, the LED assembly 1 comprises a frame 4 which surrounds the at least one LED chip 2. The frame 4 comprises at least one web 5 so as to divide the frame 4 into at least a first frame region 6 and at least a second frame region 7.

The first frame region 6 comprises the at least one LED chip 2. The first frame region 6 preferably further laterally delimits a transparent layer 8. This layer 8 is applied over the LED chip 2. Because of the lateral delimitation, a predefined volume is defined in such a way that using the frame 4 according to the invention it is possible to apply a layer 8 which has low viscosity, i.e. high fluidity, over the LED chip 2, since the material is clearly delimited by the predefined volume of the first frame region 6 and thus cannot flow away. In this manner, even thin layers 8 may be applied which are thinner than the thickness obtained for example when applying a globe-top layer. As a result, the amount of dispense material used may also be reduced and the layer 8 may be optimised as a result of being thinner. This is possible for example since the layer 8 is no longer restricted to the lentoid shape previously known since even low-viscosity dispense materials may be applied in the predefined frame region 6 in such a way that the surface of the layer 8 may also be formed flat, for example. The layer 8 also protects the bonding wire 3 against mechanical influences since the bonding wire is protected inside the frame region 6 and is embedded in the layer 8.

It is also conceivable in a further embodiment for a plurality of LED chips 2 to be arranged in the first frame region 6. In this case, a single continuous layer 8 may be applied over the plurality of LED chips 2.

In a further embodiment, it may also be provided for the frame 4, preferably the first frame region 6, to be provided with a lattice structure in such a way that the plurality of LED chips 2 are framed individually or in groups by means of the lattice. The individual LED chips 2 or groups of LED chips 2 may be provided with a layer 8 independently of the other LED chips 2 or groups of LED chips 2. It is thus possible to apply different materials as a layer 8 to the LED chips 8 so as to be able to obtain different colours for each LED chip 2 or group of LED chips 2 for example.

The at least one connection point A for the wire 3 is preferably also arranged in the second frame region 7. The second frame region 7, which is spatially delimited from the first frame region 6 containing the LED chip 2 and layer 8 also provides a protective region for the at least one wire 3, that is to say in particular for the wire portion of the wire 3 exposed out of the layer 8. A defined protective region for the wire 3 in the form of a protective frame which surrounds the protective region at least laterally is thus provided in a simple manner by the frame 4, without the wire 3 having to be arranged separately. The wire portion of the wire 3 that is not embedded in the layer 8 is thus effectively protected in a simple manner by the frame 4 which further provides a predefined volume for the dispense layer 8.

By means of the simple arrangement of the frame 4 and its two regions 6, 7, a precisely predefined volume for a layer 8 to be arranged over the LED chip 2 is provided on the one hand, in which layer the wire 3 is simultaneously protected and embedded. On the other hand, the sensitive fine bonding wire 3 is effectively protected against mechanical influences, even in the regions in which it is not embedded in a layer 8, by means of the protective region defined by the frame 4 in such a way that the wire 3 is protected over its entire length without restricting the configuration of the dispense layer 8.

As is shown in FIG. 1, the web 5 is preferably formed integrally with the frame 4 in a single piece. This integral configuration means that the individual parts of the frame 4 are already directly aligned relative to one another before they are fixed to a carrier T. It is thus easier to position and fix in place the frame 4 and the bonding wires 3. Production and process steps during manufacture and assembly are also reduced, thus lowering the cost of the LED assembly 1.

It is, however, also conceivable for the frame 4 to be formed in a plurality of parts, preferably in two parts—a first frame part and a second frame part. In an embodiment of this type, the first frame part for example forms the first frame region 6, and the second frame part forms the second frame region 7. It is thus possible individually to adjust the division of the frame, i.e. the first frame region 6 and the second frame region 7, in accordance with the configuration of the LED assembly 1. The two frame regions 6, 7 of the frame 4 may also be aligned relative to one another in a simple manner and thus be arranged optimally depending on the circumstances.

Figure 6:
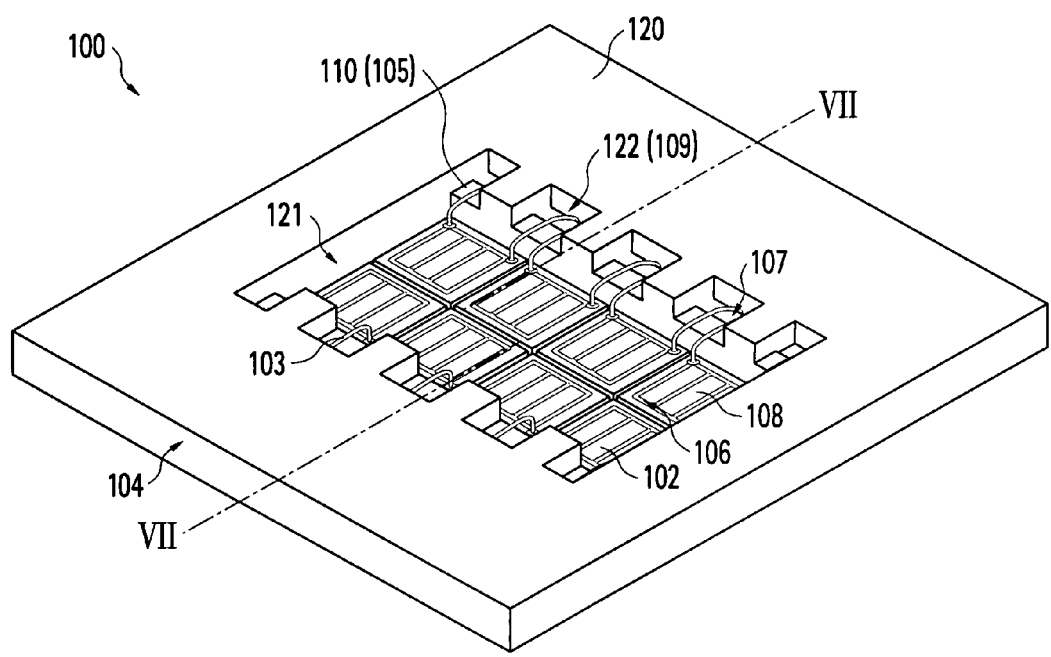
FIG. 6 is an LED assembly according to a second embodiment.

Furthermore, FIG. 6 shows a further, second embodiment, in which the first frame part 110 comprises the first frame region 106 and the second frame region 107, and the second frame part 120 is arranged on the first frame part 110 in such a way that the second frame region 107 of the first frame part 110 is covered, at least in part. This embodiment will be explained in greater detail later in the description.

The frame 4 is preferably formed of an electrically non-conductive material. This may be for example ceramic, plastics material, metal, silicone, glass, carbon fibre, fibreglass, silicon or a combination thereof. The material of the frame is preferably temperature-resistant, for example up to a temperature of at least 150° C. By applying a layer 8, it is thus possible reliably to protect the material against the elevated temperatures which usually occur during the process of curing the dispense material and thus to avoid damaging the frame 4.

Preferably, the material of the frame also has good adhesion. It is thus possible to assemble the frame 4 and the LED assembly 1 in a simple manner and a long service life is also ensured since the frame 4 can be reliably fixed to the carrier T.

As can be seen in particular from FIG. 2, the layer 8 is preferably applied over the LED chip 2 so as to protect the wire 3 in the region of the first frame region 6 against mechanical influences. The protective layer 8 thus preferably consists of a colour-conversion layer which absorbs some light of a first wavelength and emits light of a second wavelength. The function of protecting the wire 3 by means of the layer 8 is thus simultaneously assumed by the colour-conversion layer. An LED assembly 1, that is to say also white LEDs in particular may thus be provided in a simple manner, which effectively protects the bonding wires 3 and in which the entire structure is simultaneously considerably simplified.

The layer 8 may also be a transparent layer or a diffuser layer. The use of a transparent layer is particularly advantageous in the case of monochrome LEDs. The layer 8 thus simultaneously assumes the function of protecting the bonding wires 3 and the function of a transparent layer or diffuser layer or any other layer 8 suitable for LEDs.

Because of the configuration of the frame 4 according to the invention, the layer 8 may be applied using a dispense material, such as a colour-conversion material having low viscosity, i.e. in a more freely flowing state than, for example, in the case of a globe-top layer, in such a way that, as described above, it is also easier to apply the dispense material because of the LED assembly 1 according to the invention.

As can be seen from FIG. 1 and, in particular, FIG. 2, the wire 3 is preferably curved over the web 5 and extends from the first frame region 6 into the second frame region 7. One end of the wire 3 can thus be bonded in the first frame region 6, i.e. to the LED chip 2, whilst the other end of the wire 3 can be bonded in the second frame region 7 to the connection point A. The two regions 6, 7 are thus divided in a simple manner, the volume for the layer 8 in the first frame region 6 being able to be clearly predefined whilst, on the other hand, the wire 3 is arranged safely in the two frame regions 6, 7 and is thus protected against mechanical influences. Because the frame regions 6, 7 are easily accessible, it is easier to bond the wire 3 whilst at the same time the bonding wire 3 is provided with a greater degree of protection.

The frame 4 is preferably configured in such a way that at least the second frame region 7 extends above the wire 3 at its highest point, i.e. the point at which the wire 3 is arranged in a curved manner over the web 5. The wire 3 is thus effectively protected against mechanical influences by means of the corresponding side walls of the frame 4 since it does not extend above the frame 4, at least not above the second frame region 7.

As can be seen in particular in FIGS. 1 and 2, the web 5 preferably comprises at least one recess 9. This recess is particularly preferably a setback which extends on the upper edge of the web 5 from the first frame region 6 to the second frame region 7. The wire 3 is fixed in such a way that the wire portion curved over the web 5 is arranged over the entire width of the web 5 in the recess 9 and the wire 3 extends both before and after the web 5, i.e. into the first and second frame regions 6, 7, towards the LED chip 2 and the connection point A respectively in such a way that said wire portion curved over the web 5 represents the highest point of the wire 3. This is particularly but not exclusively advantageous in the case of a one-piece frame 4 since the frame walls and the web 5 can thus be configured so as to be of equal height whilst the wire 3, however, does not extend above the frame 4. As a result, in addition to the wire portion which is embedded within the layer 8 in the first frame region 6 and the wire portion which is arranged in the protective region of the second frame region 7, the wire portion which extends in a curved manner over the web 5 in the recess 9 may also be effectively protected against mechanical influences. The bonding wire 3 may thus be effectively protected along its entire length and does not have to be separately positioned.

Figure 3:
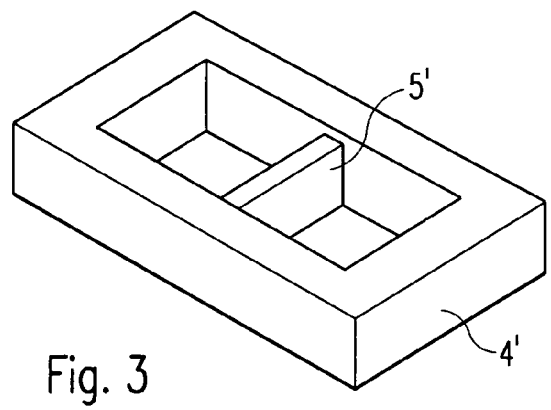
FIG. 3 is a perspective view of a frame according to the invention for an LED assembly according to the first embodiment in accordance with a first variant.
Figure 4:
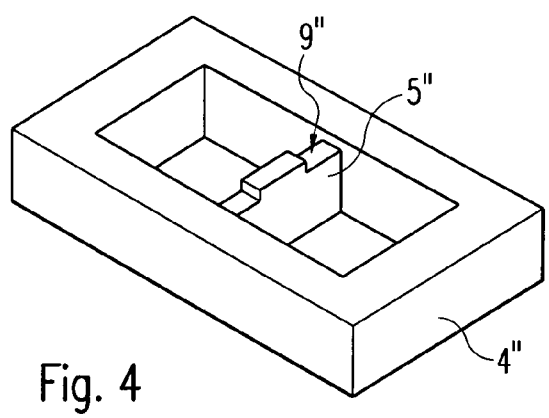
FIG. 4 is a perspective view of a frame according to the invention of an LED assembly according to the first embodiment in accordance with a second variant.
Figure 5:
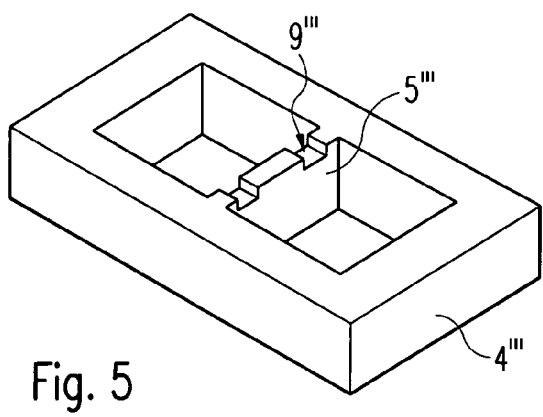
FIG. 5 is a perspective view of a frame according to the invention for an LED assembly according to the first embodiment in accordance with a third variant.

FIGS. 3 to 5 show three preferred embodiments of a frame 4', 4", 4'" in accordance with the first embodiment which comprise different webs 5', 5", 5'" respectively. The web 5' in FIG. 3 is thus configured in such a way that the rest of the side walls of the frame 4' extend above the web 5', at least in part, the entire surface of the web 5' thus being arranged below the highest upper edge of the frame. A wire 3 which is arranged in a curved manner over the web 5' is thus protected against mechanical influences by the regions of the frame 4' which extend above the web 5'.

FIGS. 4 and 5 further show different preferred embodiments of recesses 9", 9'" in the webs 5", 5'" of a frame 4", 4'", in which the curved wire portion of the wire 3, as already described above, may be arranged so as to effectively protect this wire. The recesses 9, 9", 9'" are thus preferably at least as wide (transverse to the direction in which the wire 3 extends) as the wire 3, so the wire is securely arranged in the recesses. The narrower and deeper the recess 9, 9", 9'", the better protected the wire 3 arranged therein. The wider the recess 9, 9", 9'", the easier it is to arrange the wire 3 therein, and the lower the recess 9, 9", 9'", the thicker the layer 8 can be, for the same height of the frame 4", 4'".

The upper edge of the first frame region 6 is preferably of at least such a height that it finishes in line with the surface of the layer 8 over the LED chip 2. The layer 8 is in turn preferably so thick that it finishes, at most, in line with the lowest upper edge of the frame 4, preferably the first frame region 6, the web 5 or the recess 9. It is thus considerably easier to dispense a predefined optimised layer 8 which is as thin as possible. The height of the frame 4 may also be minimised in such a way that the overall size of the LED assembly 1 can also be reduced.

The upper limit of the thickness of the frame may be measured in terms of millimetres whereas the lower limit of the thickness of the frame 4 is selected in such a way that the thickness of the frame 4 corresponds at least to the height of the LED chip 2. A typical height for an LED chip 2 is, for example, 100 µm. The total height of the frame 4 is thus preferably within a range of 100 to 500 µm, particularly preferably within a range of approximately 250 µm. The invention is, however, not limited to the aforementioned measurements.

A preferred method for producing an LED assembly 1 in accordance with the first embodiment will be described hereinafter.

In a first step, the at least one LED chip 2 is fixed to the carrier T. This takes place for example by adhesively bonding or soldering the LED chip 2 to a circuit board. Subsequently, the frame 4 comprising the web 5 which divides the frame 4 into at least a first frame region 6, which laterally delimits the layer 8, and at least a second frame region 7, which forms the protective region for the at least one bonding wire 3, is fixed to the carrier T in such a way that the first frame region 6 surrounds the at least one LED chip 2. The frame 4 is preferably adhesively bonded to the carrier T for this purpose but any other type of fixing is also conceivable. In a third step, the at least one wire 3 is bonded to the LED chip 2 in the first frame region 6 and to the connection point A on the carrier T in the second frame region 7. The bonding wire 3, which is extremely fine, thus extends in a curved manner over the web 5 from the first frame region 6 into the second frame region 7 and is also preferably arranged in recesses 9 of the web 5, in which the wire 3 is better protected. The bonding wire 3, which is extremely fine, is thus mechanically protected, in particular from above, and is less exposed. In a final step, a layer 8 is applied over the LED chip 2 in the first frame region 6. Because of the volume predefined by the frame 4, thin protective layers 8, for example with dispense materials having low viscosity, can be easily applied which are thinner than the thickness which occurs, for example, when applying a globe-top layer. As a result, there are considerably more possibilities for configuring the layer 8.

Figure 7:
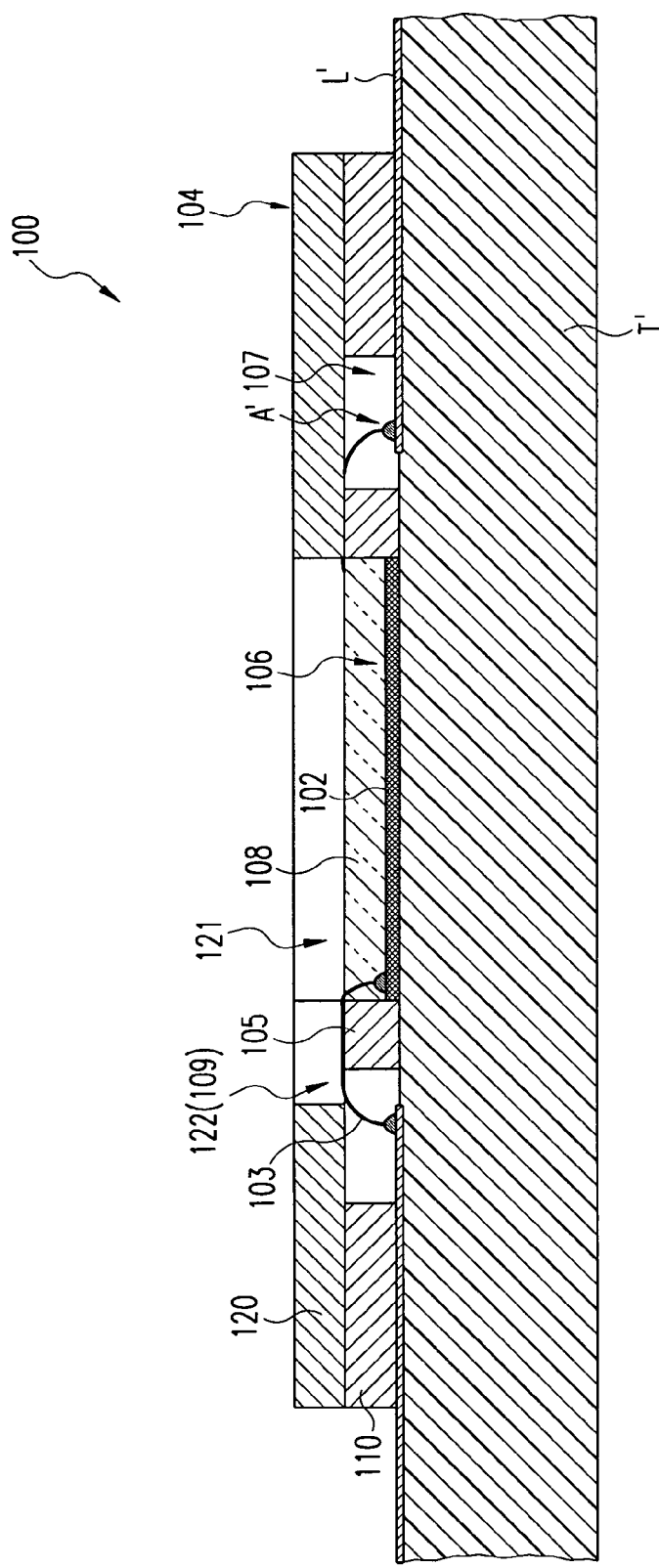
FIG. 7 is a sectional view of the LED assembly according to the invention along line VII-VII in FIG. 6.

FIGS. 6 and 7 show a second, preferred embodiment of an LED assembly 100, FIG. 7 being a sectional view along line VII-VII of FIG. 6. This LED assembly 100 comprises a plurality of features of the LED assembly 1 in accordance with the first embodiment in such a way that reference is made substantially to the embodiments above and hereinafter only the essential features are considered in detail.

The LED assembly 100 according to the second embodiment also comprises at least one LED chip 102 which is arranged on a carrier T'. The LED chip 102 preferably emits a light of a first wavelength. The LED chip 102 is connected to at least one wire 103. The LED assembly 100 further comprises a frame 104 which surrounds the at least one LED chip 102. The frame further comprises at least one web 105, two webs 105 in the present preferred embodiment. By means of these webs 105, the frame is divided into at least a first frame region 106 and at least a second frame region 107. The first frame region 106 thus comprises the at least one LED chip 102. As can be seen from FIGS. 6 and 7, it is however also possible for a plurality of LED chips 102 to be arranged within a single frame 104, as has already been described above in detail in the first embodiment. A lattice structure or lattice division within the frame 104, as was also described with regard to the first embodiment, is also conceivable. The first frame region 106 also preferably laterally delimits a transparent layer 108 which is applied over the LED chip 102. In addition, the second frame region 107 also preferably forms a protective region for the at least one wire 103. As in the first embodiment, the wire 103 is also preferably bonded to the LED chip 102 in the first frame region 106 and to a connection point A', for example a conductor L' in this embodiment. The wire 103 thus preferably extends in a curved manner over the web 105 from the first frame region 106 into the second frame region 107.

According to this second embodiment, the frame 104 is formed in at least two parts—a first frame part 110 and a second frame part 120. The second frame part 120 is preferably arranged on the first frame part 110.

Figure 8A:
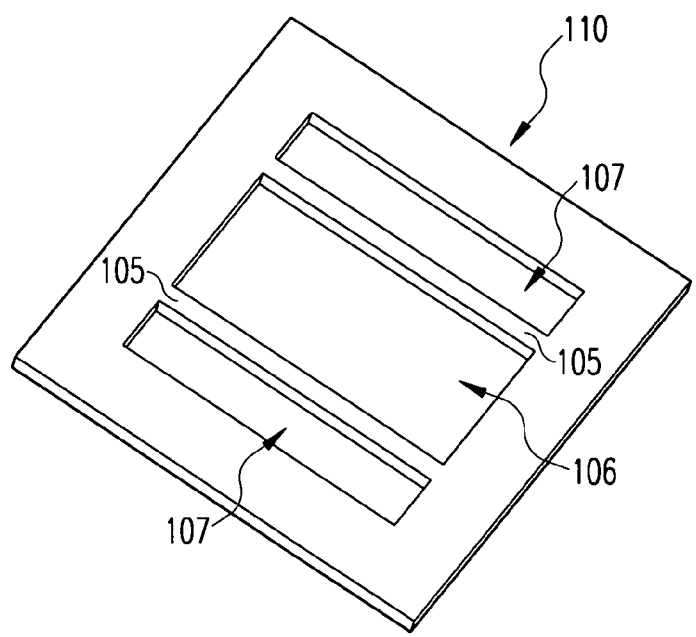
FIG. 8a is a perspective view of a first frame part of an LED assembly according to FIG. 6.

FIG. 8a shows a preferred embodiment of a first frame part 110. The first frame part 100 preferably comprises both the first frame region 106 and the second frame region 107. The two frame regions 106, 107 are preferably divided by the at least one web 105 which is particularly preferably formed integrally with the first frame part 110. The web may, when it is formed integrally with the first frame part 110, also be flatter, in which case the height of the LED assembly 100 can be configured in a particularly optimised manner. As a result of the lateral delimitation of the first frame part 106 and the consequent possible use of dispense materials having low viscosity, the configuration options for the LED assembly 100 and the layer 108 are thus increased, it being possible simultaneously to reduce the amount of dispense material required, for example compared to a globe-top layer. In this regard, reference is made to the description relating to the first embodiment.

Figure 8B:
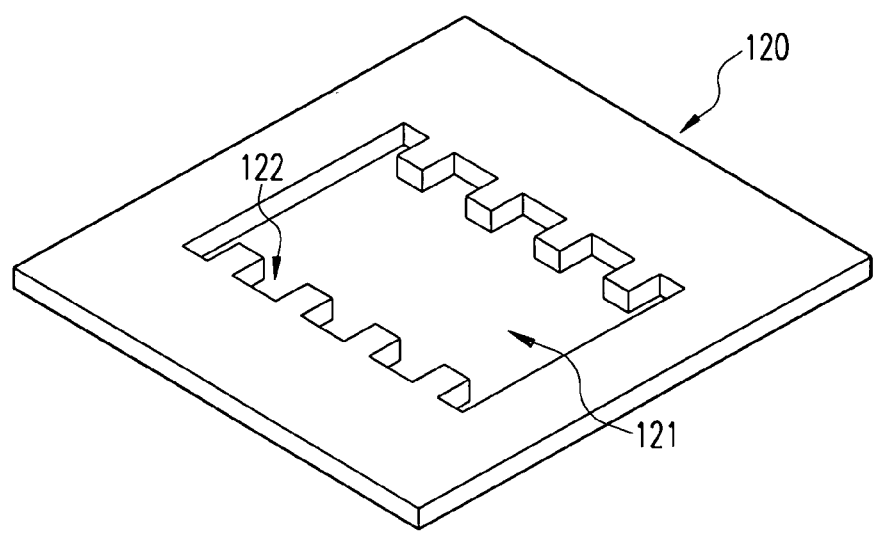
FIG. 8b is a perspective view of a second frame part of an LED assembly according to FIG. 6.

FIG. 8b further shows the second frame part 120. The second frame part 120 preferably comprises an opening 121 and at least one recess 122 starting from the opening.

FIG. 7 is a sectional view of the assembled LED assembly 100. The second frame part 120 is arranged on the first frame part 110. As a result of the opening 121 arranged in the second frame part 107, the first frame region 106 of the first frame part 110 is preferably exposed from above. The layer 108 can thus be easily applied to the LED chip 102 in the first frame region 106 when in the assembled state. The wire 103 is thus safely embedded in the layer 108 in the first frame region 106.

The light which is emitted by the LED chip 102 may also radiate freely in an upwards direction.

The recess 122 preferably extends above the web 105 from the first frame region 106 towards the second frame region 107 of the first frame part 110, preferably in the shape of a path 109 in such a way that the second frame region 107 of the first frame part 110 is also exposed, at least in part. The at least one wire 103 may thus safely extend in a curved manner over the web 105 from the LED chip 102 in the first frame region 106 to the contact points A', which are arranged in the second frame region 107, the wire 103 being arranged in a protected manner within the path 109 which is formed by the recess 122. The recess 122 is thus preferably formed in such a way that the second frame region 107 is exposed to an extent which is slightly greater than the diameter of the bonding wire 103, so as to protect the bonding wire 103 as much as possible, preferably by covering a maximum of the second frame region 107 with the first frame part 110. In particular, if a plurality of LED chips 102 are arranged in the first frame region 106, it is particularly advantageous for a plurality of recesses 122 to be provided in the second frame part 120. The plurality of wires 103 extending from the first frame region 106 into the second frame region 107 may thus extend individually or in groups over the web 105 through a respective recess 122 or path 109 and are thus effectively protected against mechanical influences by means of narrower recesses 122.

The wire(s) 103 is/are thus better protected inasmuch as the second frame part 120 can be fixed in place once the bonding wires 103 have been bonded. When the first frame part 110 is fixed to the carrier T', it is easier to access the two frame regions 106, 107, since they are configured and arranged so as to be open from above. The bonding wire(s) 103 may thus be bonded in a particularly simple manner to the LED chip 102 in the first frame region 106, and to the connection point A' in the second frame region 107. Because the second frame part 120 is fixed to the first frame part 110 after bonding, the first frame region 107 is then covered in such a way that the bonding wire 103 is effectively protected from above in this region 107. When configuring the first frame part 110, there is thus no need to consider the accessibility of the contacts during bonding since the second frame region 107 is only covered at least in part by the subsequent arrangement of the second frame part 120. When fitting the second frame part 120 on the first frame part 110, paths 109 are also formed over the webs 105 by means of the recesses 122, inside which paths the wires 103 can be arranged so as to extend in a curved manner from the first frame region 106 into the second frame region 107 and are effectively protected. The wires 103 are thus made more accessible during bonding whilst, at the same time, also being particularly effectively protected against external mechanical influences.

A preferred method for producing an LED assembly 100 according to the second embodiment will be described hereinafter.

In a first step, the at least one LED chip 102 is fixed to the carrier T'. This is preferably achieved by adhesively bonding or soldering the LED chip 102 to a circuit board. In a second step, the first frame part 110 of the frame 104 which is divided by the at least one web 105 into at least a first frame region 106, which laterally delimits the layer 108, and at least a second frame region 107, which forms a protective region for the at least one bonding wire 103, is fixed to the carrier T', the first frame region 106 surrounding the at least one bonding wire 103. In a third step, the at least one wire 103 is bonded to the LED chip 102 and to a connection point A' of the carrier T'. This can be achieved in a particularly simple manner since, in particular, the second frame region 107 also is completely exposed from above and the regions 106, 107 are thus particularly easily accessible. In a fourth step, the second frame part 120 of the frame 104 is fixed to the first frame part 110. The second frame region 107 is thus covered as much as possible in such a way that the bonding wire is effectively protected in this region 107 and does not have to be positioned separately. By means of the recesses 122 formed in the opening 121 of the second frame part 120, a path 109 is formed above the web 105 of the first frame part 110, in which path the wire portion of the wire 103 extending in a curved manner over the web 105 from the first frame region 106 into the second frame region 107 is effectively protected against mechanical influences. In a final step, the layer 108 is applied over the LED chip 102 in the first frame region 106 of the first frame part 110. The layer 108 may thus, for example, be a colour-conversion layer, a transparent and/or a diffuser layer in such a way that the layer 108 also assumes the task of protecting the bonding wires 103 in addition to the aforementioned advantages exhibited when using the respective layer materials.

By means of the aforementioned method, an LED assembly 1, 100 according to the invention may be produced which is of simple construction, can be easily assembled and effectively protects the bonding wires 3, 103 over their entire length.

The invention is in no way limited to the aforementioned features. All conceivable configurations of the embodiments disclosed are covered by this application. The height and thickness of the frame for example are not limited by the preferred measurements thereof given in the description. The material of the frame is also not limited to the materials disclosed. The layer may comprise all materials known within the field of LED technology and is not limited with regard to thickness or strength.

LIST OF REFERENCE NUMERALS 1, 100 LED assembly
2, 102 LED chip
3, 103 bonding wire
4-4''', 104 frame
5-5''', 105 web
6, 106 first frame region
7, 107 second frame region
8, 108 dispense layer, protective layer
9, 9'', 9''' recess
109 path
110 first frame part
120 second frame part
121 opening in second frame part
122 recess in second frame part.

The invention claimed is:

1. LED assembly, comprising:
a carrier;
at least one LED chip, which is arranged on the carrier, the LED chip being connected to at least one bonding wire;
a transparent layer applied over the LED chip;
a frame which surrounds the at least one LED chip, wherein
the frame comprises at least one web so as to divide the frame into at least a first frame region, which comprises the at least one LED chip, and at least a second frame region,
the first frame region laterally delimiting the layer, and
the second frame region forming a protective region for the at least one bonding wire, wherein the bonding wire is guided over the web such that it does not extend above the frame and is protected by the corresponding side walls of the frame.

2. LED assembly according to claim 1, wherein the frame is formed of at least two parts including a first frame part and a second frame part.

3. LED assembly according to claim 2, wherein the first frame part forms the first frame region and the second frame part forms the second frame region.

4. LED assembly according to claim 2, wherein the first frame part comprises the first frame region and the second frame region, and the second frame part is arranged on the first frame part in such a way that the second frame region of the first frame part is at least partly covered.

5. LED assembly according to claim 2, wherein the web is formed integrally with the frame.

6. LED assembly according to claim 1, wherein the layer consists of a color-conversion layer which absorbs some light of a first wavelength and emits light of a second wavelength.

7. LED assembly according to claim 1, wherein the layer is a transparent layer.

8. LED assembly according to claim 1, wherein the layer is a diffuser layer.

9. LED assembly according to claim 1, wherein the bonding wire extends in a curved manner over the web from the first frame region into the second frame region.

10. LED assembly according to claim 9, wherein the web comprises at least one recess, in which the wire portion of the bonding wire curved over the web is arranged in a protected manner.

11. LED assembly according to claim 10, wherein the recess comprises at least one setback, in which the wire portion of the bonding wire curved over the web is arranged in a protected manner.

12. LED assembly according to claim 1, wherein the upper edge of the first frame region is at least of such a height that it finishes in line with the surface of the layer applied over the LED chip.

13. LED assembly according to claim 1, wherein the height of the frame extends above the bonding wire at the highest point thereof.

14. LED assembly according to claim 1, wherein the frame is formed of an electrically non-conductive material, for example ceramic, plastics material, metal, silicone, glass, carbon fiber, fiberglass, silicon or a combination thereof.

15. LED assembly according to claim 14, wherein the material of the frame is temperature-resistant up to a temperature of at least 150° C.

16. LED assembly according to claim 14, wherein the material of the frame can be adhered effectively.

17. Method for producing an LED assembly, comprising:
fixing at least one LED chip to a carrier;
fixing a frame comprising a web which divides the frame into a first frame region, which laterally delimits a layer, and a second frame region, which forms a protective region for at least one bonding wire, to the carrier, the first frame region surrounding the at least one LED chip;
bonding at least one bonding wire to the LED chip in the first frame region, and to a connection point on the carrier in the second-frame region; and
applying a layer over the LED chip in the first frame region.

18. Method for producing an LED assembly, comprising:
fixing at least one LED chip to a carrier;
fixing a first frame part of a frame which is divided by at least one web into at least a first frame region, which laterally delimits a layer, and at least a second frame region, which forms a protective region for at least one bonding wire, to the carrier, the first frame region of the first frame part surrounding the at least one LED chip;

bonding the at least one bonding wire to the LED chip in the first frame region, and to a connection point on the carrier in the second frame region;

fixing a second frame part of the frame to the first frame part; and applying a layer over the LED chip in the first frame region of the first frame part.

19. Method according to claim 17, wherein the layer consists of a color-conversion layer which absorbs some light of a first wavelength and emits light of a second wavelength.

20. Method according to claim 17, wherein the layer is a transparent layer.

21. Method according to claim 17, wherein the layer is a diffuser layer.

* * * * *